(12) United States Patent
Sung et al.

(10) Patent No.: US 8,191,244 B2
(45) Date of Patent: Jun. 5, 2012

(54) FABRICATING METHOD OF CIRCUIT BOARD

(75) Inventors: Shang-Lin Sung, Taipei County (TW); Shih-Chiehmr Chang, Taipei (TW); Chao-Sheng Chiu, Taoyuan County (TW); Chin-Cheng Lee, Hualien County (TW)

(73) Assignee: Unimicron Technology Corp., Taoyuan (TW)

( * ) Notice: Subject to any disclaimer, the term of this patent is extended or adjusted under 35 U.S.C. 154(b) by 93 days.

(21) Appl. No.: 12/878,586

(22) Filed: Sep. 9, 2010

(65) Prior Publication Data

US 2012/0006478 A1 Jan. 12, 2012

(30) Foreign Application Priority Data

Jul. 6, 2010 (TW) .............................. 99122239 A

(51) Int. Cl.
*H05K 3/34* (2006.01)

(52) U.S. Cl. ................. 29/830; 29/825; 29/832; 29/840; 29/846; 29/852

(58) Field of Classification Search ..................... 29/825, 29/830, 832, 840, 846, 852
See application file for complete search history.

(56) References Cited

U.S. PATENT DOCUMENTS

| 7,602,062 | B1 * | 10/2009 | Wang | 257/738 |
| 7,754,598 | B2 * | 7/2010 | Lin et al. | 438/618 |
| 2008/0060838 | A1 * | 3/2008 | Chen et al. | 174/262 |

FOREIGN PATENT DOCUMENTS

| JP | 2006332115 | 12/2006 |
| TW | 200834764 | 8/2008 |
| TW | 200850099 | 12/2008 |

* cited by examiner

*Primary Examiner* — Carl Arbes
(74) *Attorney, Agent, or Firm* — WPAT., P.C.; Justin King

(57) ABSTRACT

A fabricating method of a circuit board including the following steps. First, a liquid material is adhered between a first substrate and a second substrate by using an atmospheric pressure difference. Then, a plurality of conductive columns are formed in the first substrate and the second substrate. Next, a patterning process is performed, so as to form two circuit layers. Next, two lamination structures are formed respectively on the circuit layers. Then, the first substrate and the second substrate are separated. Finally, another patterning process is performed, so as to finish the fabrication of the circuit board.

10 Claims, 8 Drawing Sheets

FABRICATING METHOD OF CIRCUIT BOARD

CROSS-REFERENCE TO RELATED APPLICATION

This application claims the benefit of Taiwan Patent Application No. 099122239, filed on Jul. 6, 2010, which is hereby incorporated by reference for all purposes as if fully set forth herein.

BACKGROUND OF THE INVENTION

1. Field of Invention

The present invention relates to a fabricating method of a circuit board, and more particularly to a fabricating method of a multi-layer circuit board.

2. Related Art

A circuit board fabricated by a present circuit board process usually has a symmetrical structure. That is to say, the number of the circuit layers is mostly even, e.g. two layers, four layers, or six layers, but the circuit board having an odd number of layers equal to three or more than three is seldom fabricated.

FIG. 1A to FIG. 1F are schematic sectional views of process flow of a conventional fabricating method of a circuit board. Referring to FIG. 1A, the conventional circuit board fabricating method includes the following steps. First, a copper-clad laminate (CCL) 110 is provided, wherein the CCL 110 includes a resin layer 112 and two copper layers 114, and the resin layer 112 is disposed between the two copper layers 114.

Referring to FIG. 1B, next, a laser drilling process is used to form at least one blind via V1 in the CCL 110, and the blind via V1 penetrates the resin layer 112 and partially exposes one of the copper layers 114.

Referring to FIG. 1C, a plating hole process is performed in the blind via V1, so as to form a copper column 120 in the blind via V1, and the copper columns 120 connect to the copper layers 114.

Referring to FIGS. 1C and 1D, the copper layers 114 undergo a lithographic process and an etching process to remove a part of the copper layers 114 and further to form two circuit layers 122 that partially expose the resin layer 112.

Referring to FIG. 1E, then, two prepregs 140 and two copper foils 150 are respectively laminated on the circuit layers 122, in which each prepreg 140 adheres to one copper foil 150 and one circuit layer 122, and the prepregs 140 are respectively located on two opposite sides of the resin layer 112.

Referring to FIG. 1F, a plurality of copper columns 160 are formed in the prepregs 140, and the copper columns 160 connect to the circuit layers 122 and the copper foils 150. The copper columns 160 may be formed in the method which is the same as the copper columns 120, and the details will not be repeated herein again.

Referring to FIGS. 1F and 1G, then, the copper foils 150 undergo a lithographic process and an etching process to remove a part of the copper foils 150 and further to form two circuit layers 152 that partially expose the prepregs 140. Till now, a circuit board 100 having four circuit layers (i.e. two circuit layers 122 and two circuit layers 152) is complete.

It can be seen from the above that the current circuit board process is mostly applicable to fabricating the circuit board having an even number of layers. However, as technology advances, the circuit design of the circuit board becomes more various, so that the demands for the circuit board having an odd number of layers increase. Therefore, how to achieve the mass fabrication of the circuit board having an odd number of layers has become a topic to be researched.

SUMMARY OF THE INVENTION

The present invention is directed to a fabricating method of a circuit board, which is adapted to fabricating a multi-layer circuit board, and more particularly to fabricating a multi-layer circuit board having an odd number of layers.

The present invention provides a fabricating method of a circuit board comprising the following steps. First, a liquid material is adhered between a first substrate and a second substrate by using an atmospheric pressure difference. The first substrate comprises two first metal layers and a first dielectric layer disposed between the first metal layers. The second substrate comprises two second metal layers and a second dielectric layer disposed between the second metal layers, wherein the liquid material adheres to one of the first metal layers and one of the second metal layers. Next, at least one first conductive column connecting to the first metal layers is formed in the first dielectric layer, and at least one second conductive column connecting to the second metal layers is formed in the second dielectric layer. Next, the first metal layer and second metal layer both without adhered by the liquid material is patterned to respectively form a first circuit layer and a second circuit layer. Next, a first lamination structure is formed on the first circuit layer, and a second lamination structure is formed on the second circuit layer, wherein the first lamination structure comprises a third metal layer, and the second lamination structure comprises a fourth metal layer. Then, the first metal layer and the second metal layer both adhered by the liquid material are separated. Finally, the first metal layer, the second metal layer, the third metal layer and the fourth metal layer are patterned after the first metal layer and the second metal layer are separated.

The present invention adopts a liquid material and atmospheric pressure difference to adhere to a first substrate and a second substrate, so that the mass fabrication of the circuit board having an odd number or an even number of circuit layers greater than three is achieved. Thus, the present invention may be used to fabricate a variety of circuit boards having different layers to satisfy the various circuit designs of the circuit board.

In order to make the above features and advantages of the present invention apparent and easy to understand, the preferred embodiments accompanying with figures are illustrated hereinafter.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
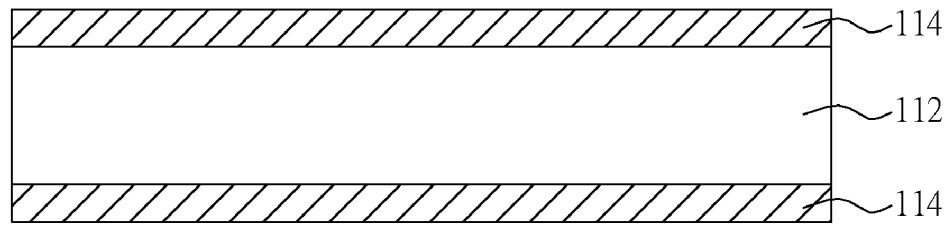
FIG. 1A to FIG. 1G are schematic sectional views of process flow of a conventional fabricating method of a circuit board.
Figure 1B:
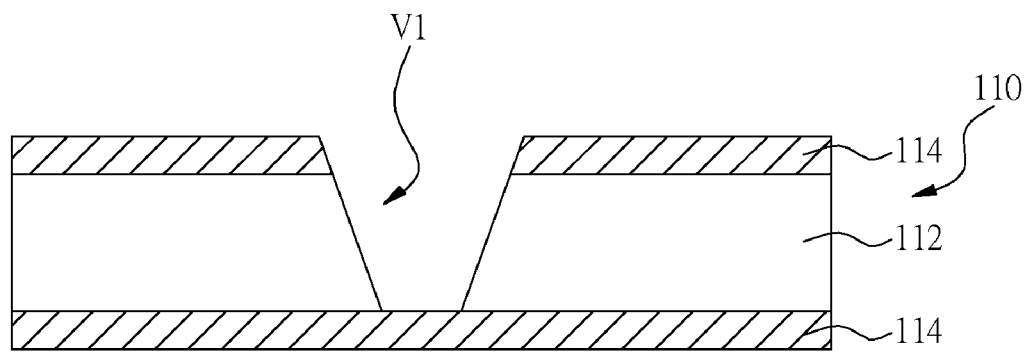
Figure 1C:
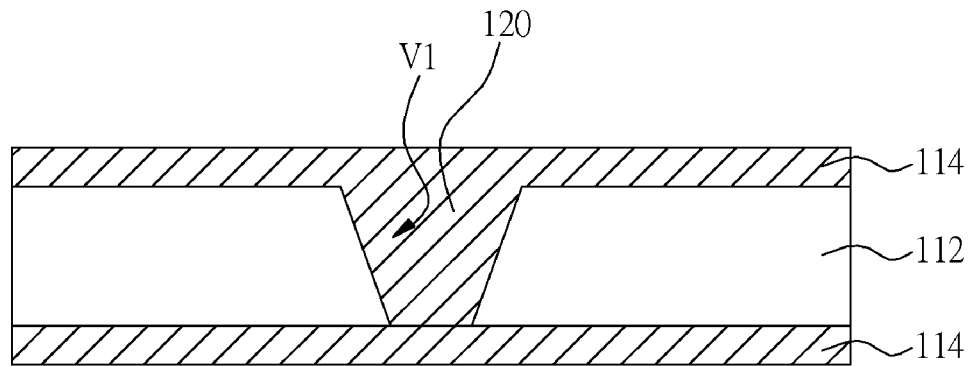
Figure 1D:
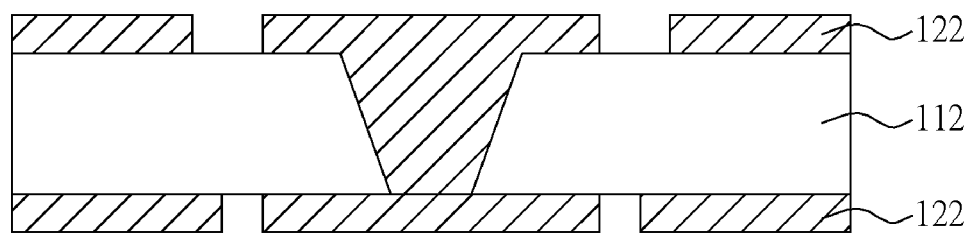
Figure 1E:
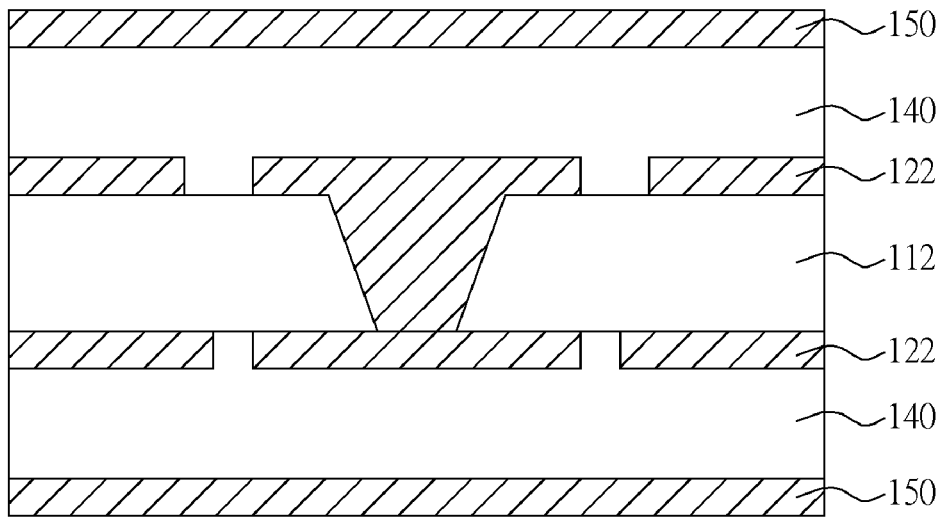
Figure 1F:
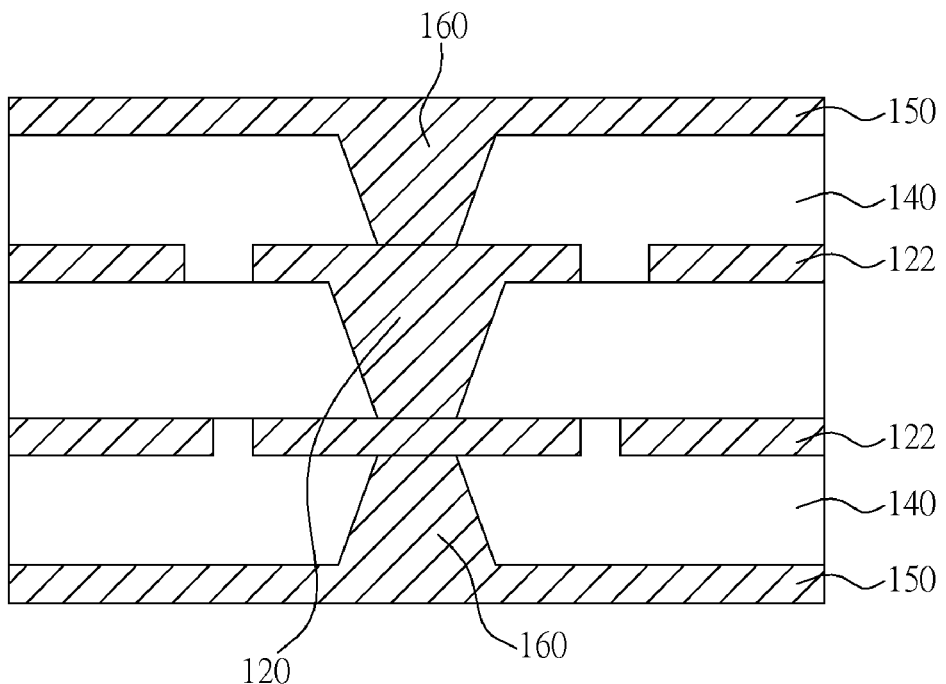
Figure 1G:
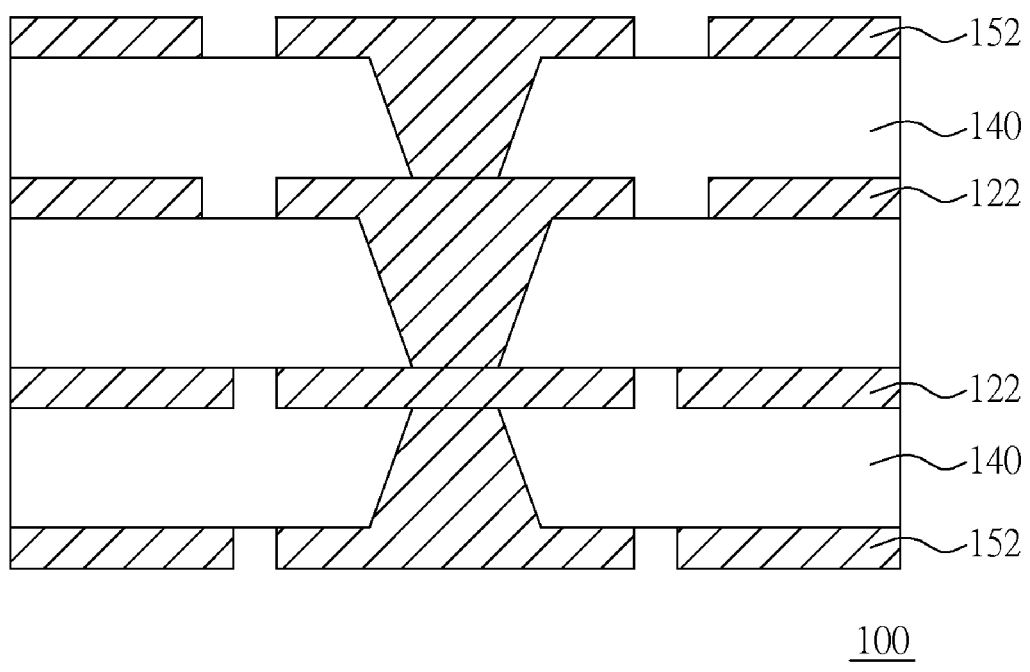
Figure 2A:
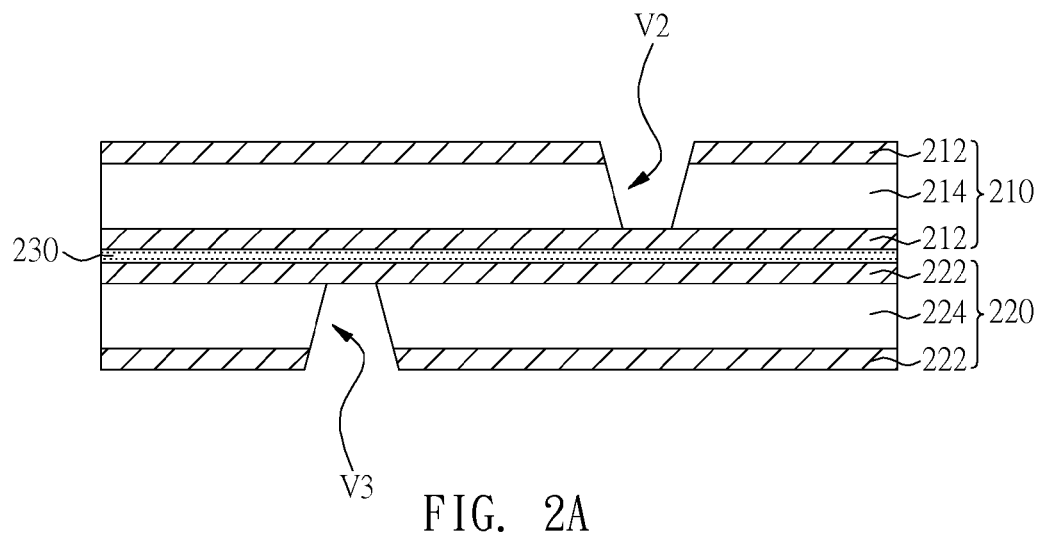
FIG. 2A to FIG. 2G are schematic sectional views of process flow of a fabricating method of a circuit board according to a preferred embodiment of the present invention.

FIG. 2A to FIG. 2G are schematic sectional views of process flow of a fabricating method of a circuit board according to a preferred embodiment of the present invention. Referring to FIG. 2A, the fabricating method of a circuit board includes the following steps. First, a liquid material 230 is adhered between a first substrate 210 and a second substrate 220 by using an atmospheric pressure difference, in which the liquid material 230 may be water, inorganic salt aqueous solution, or other liquid materials, and preferably organic solution.

Based on the above, the water may be distilled water, deionized (DI) water, hard water, soft water, or ordinary tap water. The organic solution is, for example, alcohol, and the inorganic salt aqueous solution may be aqueous solution containing metal ions, such as copper sulfate solution.

The liquid material 230 adheres to the first substrate 210 and the second substrate 220 in a manner of atmospheric pressure difference. In details, the liquid material 230 is compressed by the first substrate 210 and the second substrate 220, and the pressure between the liquid material 230 and two substrates (i.e. the first substrate 210 and the second substrate 220) is smaller than the ambient atmospheric pressure, such that the first substrate 210 and the second substrate 220 are adhered together by the atmospheric pressure compression.

It can be known from the above that the liquid material 230 does not like the adhesive having the enough adhesion to combine two objects. That is, the viscosity of the liquid material 230 is smaller than the adhesive. Furthermore, the liquid material 230 does not adhere to the first substrate 210 and second substrate 220 in a chemical manner. After the first substrate 210 and the second substrate 220 are adhered by the liquid material 230, the intrinsic quality of the liquid material 230 remains unchangeableness. That is, chemical changes of the liquid material 230, such as curing, will not occur.

The first substrate 210 includes two first metal layers 212 and a first dielectric layer 214 disposed between the first metal layers 212, and the second substrate 220 includes two second metal layers 222 and a second dielectric layer 224 disposed between the second metal layers 222. The liquid material 230 adheres to one of the first metal layers 212 and one of the second metal layers 222, and the other first metal layer 212 and the other second metal layer 222 are not adhered by the liquid material 230.

Figure 2B:
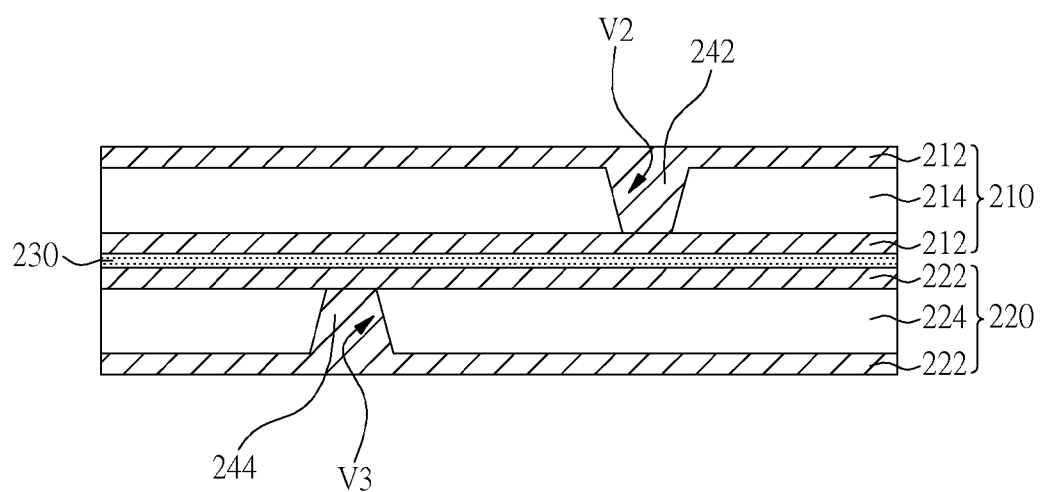

Referring to FIGS. 2A and 2B, next, at least one first conductive column 242 is formed in the first dielectric layer 214, and at least one second conductive column 244 is formed in the second dielectric layer 224. The materials of the first conductive column 242 and the second conductive column 244 are preferably copper. The first conductive column 242 connects to the first metal layers 212, and the second conductive column 244 connects to the second metal layers 222.

The method for forming the first conductive column 242 and the second conductive column 244 may include the following steps. At least one blind via V2 is formed in the first dielectric layer 214, and at least one blind via V3 is formed in the second dielectric layer 224, in which the method for forming the blind vias V2, V3 includes laser drilling process or mechanical drilling process. Furthermore, the blind vias V2, V3 may be formed before the liquid material 230 adheres to the first substrate 210 and the second substrate 220, or after the liquid material 230 adheres to the first substrate 210 and the second substrate 220.

Then, after the liquid material 230 adheres to the first substrate 210 and the second substrate 220, perform a plating hole process to the blind vias V2, V3. That is, the blind vias V2, V3 undergo an electroless plating process and an electroplating process in sequence. Thus, the first conductive column 242 and the second conductive column 244 are formed in the blind vias V2, V3 by deposition.

Figure 2C:
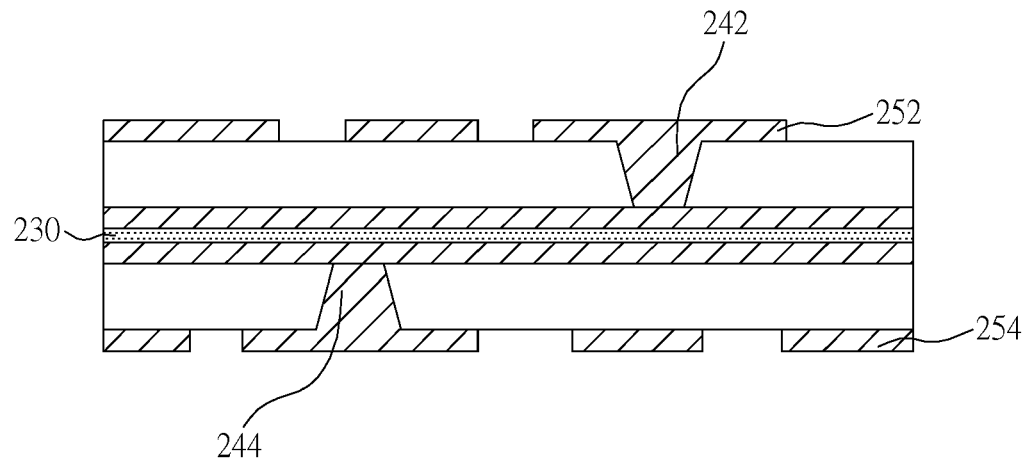

Referring to FIGS. 2B and 2C, after the first conductive columns 242 and the second conductive columns 244 are formed, the first metal layer 212 and the second metal layer 222 which are not adhered by the liquid material 230 are patterned immediately, so as to respectively form a first circuit layer 252 and a second circuit layer 254. The above patterning method may be a lithographic process and an etching process for the first metal layer 212 and the second metal layer 222. Thus, a part of the first metal layer 212 and a part of the second metal layer 222 are removed, and the first circuit layer 252 and the second circuit layer 254 are formed. The first conductive column 242 connects to the first circuit layer 252, and the second conductive column 244 connects to the second circuit layer 254.

Figure 2D:
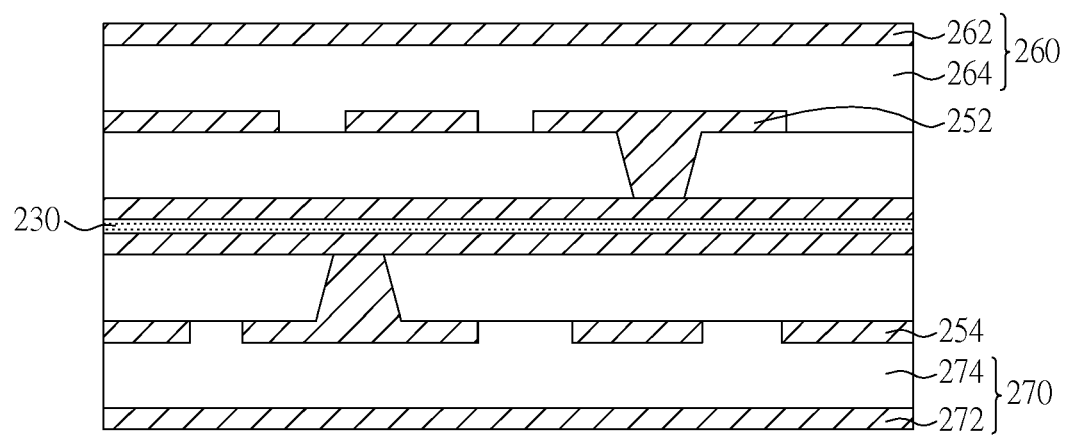

Referring to FIG. 2D, next, a first lamination structure 260 is formed on the first circuit layer 252, and a second lamination structure 270 is formed on the second circuit layer 254. The first lamination structure 260 covers the first circuit layer 252, and the second lamination structure 270 covers the second circuit layer 254. The first lamination structure 260 includes a third metal layer 262 and a third dielectric layer 264, and the second lamination structure 270 includes a fourth metal layer 272 and a fourth dielectric layer 274. The third dielectric layer 264 covers the first circuit layer 252 and the fourth dielectric layer 274 covers the second circuit layer 254.

The method for forming the first lamination structure 260 and the second lamination structure 270 may include the following steps. First, the third dielectric layer 264 covering the first circuit layer 252 is formed, and the fourth dielectric layer 274 covering the second circuit layer 254 is formed. The materials of the third dielectric layer 264 and the fourth dielectric layer 274 may be the same, such as prepregs, ABF, BT so that the two may be formed by lamination.

Then, the third metal layer 262 is formed on the third dielectric layer 264, and the fourth metal layer 272 is formed on the fourth dielectric layer 274. Both the third metal layer 262 and the fourth metal layer 272 may be metal foils, such as copper foils. Furthermore, the third metal layer 262 and the fourth metal layer 272 together with the third dielectric layer 264 and the fourth dielectric layer 274 are laminated on the first circuit layer 252 and the second circuit layer 254, and both the third metal layer 262 and the fourth metal layer 272 may be plating copper (including electroless plating process and an electroplating process).

Figure 2E:
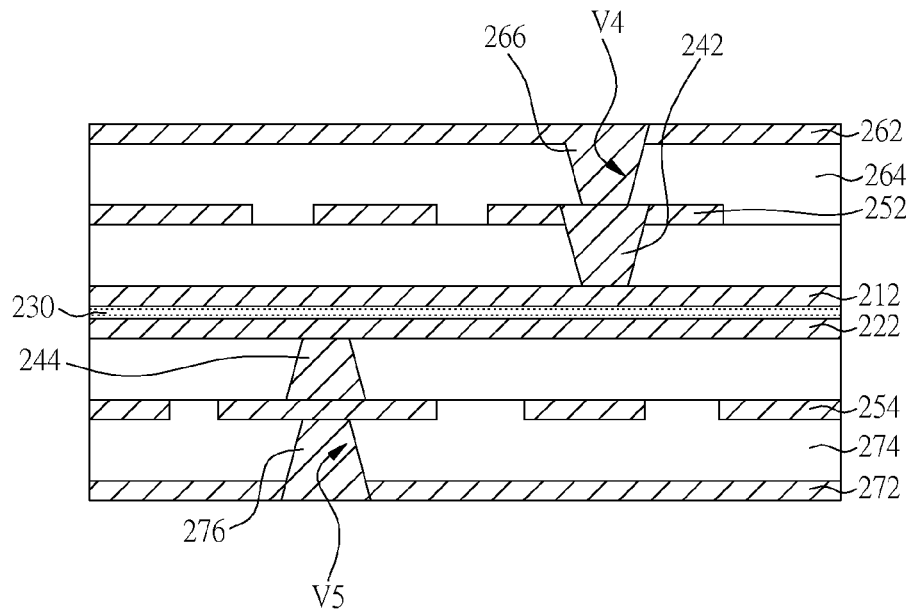

Referring to FIG. 2E, in a preferred embodiment of the present invention, the fabricating method of a circuit board further includes the following steps. At least one third conductive column 266 is formed in the third dielectric layer 264, and at least one fourth conductive column 276 is formed in the fourth dielectric layer 274, wherein the third conductive column 266 connects to the third metal layer 262 and the first circuit layer 252, and the fourth conductive column 276 connects to the fourth metal layer 272 and the second circuit layer 254.

Both the forming method and material of the third conductive column 266 and the fourth conductive column 276 are the same as those of the first conductive column 242 and the second conductive column 244, and the method for forming the third conductive column 266 and the fourth conductive column 276 includes the following steps. At least one blind via V4 is formed in the third dielectric layer 264, and at least one blind via V5 is formed in the fourth dielectric layer 274, in which the method for forming the blind vias V4, V5 is the same as that of the blind vias V2, V3. Then, after forming the blind vias V4, V5, performs a plating hole process to the blind vias V4, V5. That is to say, the blind vias V4, V5 undergo an electroless plating process and an electroplating process in sequence. Thus, the third conductive column 266 and the fourth conductive column 276 are respectively formed in the blind vias V4, V5.

Figure 2F:
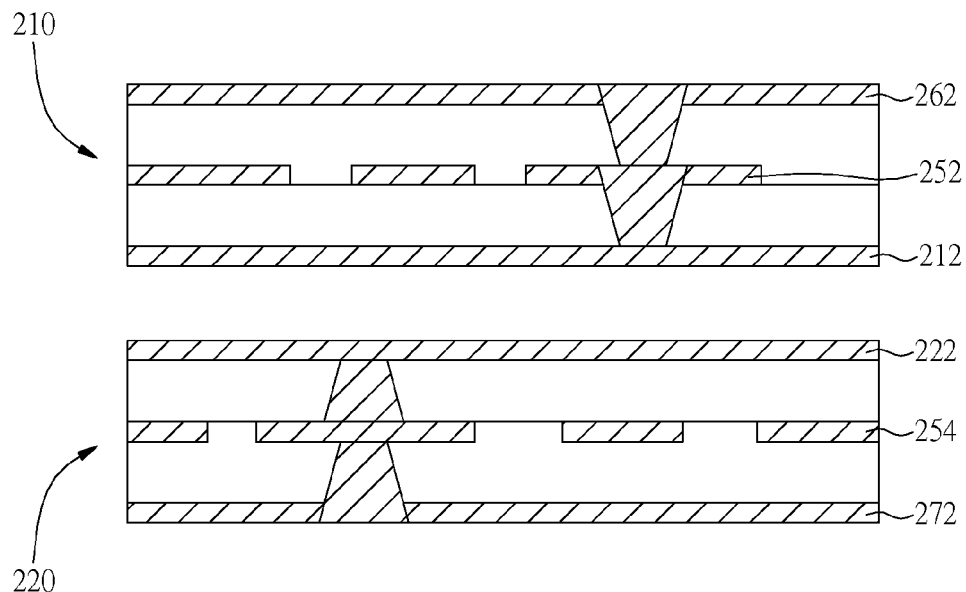

Referring to FIGS. 2E and 2F, then, the first metal layer 212 and the second metal layer 222 adhered by the liquid material 230 are separated to make the first substrate 210 and the second substrate 220 separate. The first metal layer 212 and the second metal layer 222 may be separated by hands or machines or heat or pressure. Furthermore, after the first metal layer 212 and the second metal layer 222 are separated, the surfaces of the first metal layer 212 and the second metal layer 222 may be wiped or dried or rinse pluses, so as to remove the residual liquid material 230.

Figure 2G:
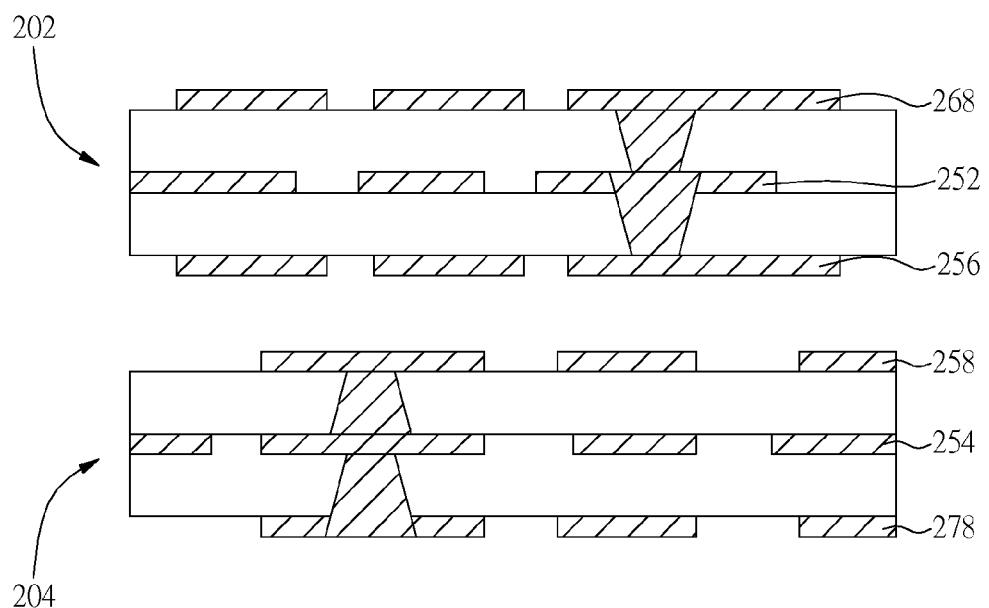

Referring to FIGS. 2F and 2G, after the first metal layer 212 and the second metal layer 222 are separated, the first metal layer 212, the second metal layer 222, the third metal layer 262, and the fourth metal layer 272 are patterned to respectively form a third circuit layer 256, a fourth circuit layer 258, a fifth circuit layer 268 and a sixth circuit layer 278. Both circuit boards 202 and 204 are complete so far.

Based on the above, the circuit board 202 includes three circuit layers altogether, namely the first circuit layer 252, the third circuit layer 256, and the fifth circuit layer 268. The circuit board 204 includes three circuit layers altogether, namely, the second circuit layer 254, the fourth circuit layer 258, and the sixth circuit layer 278. Thus it can be seen that the circuit boards 202, 204 are circuit boards with an odd number of layers having three layers.

Moreover, in other embodiments not shown, after the circuit boards 202 and 204 are complete, the circuit boards 202, 204 undergo a build-up process, so as to additionally add at least one circuit layer on the circuit boards 202 or 204. Furthermore, the circuit boards 202, 204 may be laminated on other circuit boards through a lamination process, such that the circuit boards 202, 204 become the circuit structure inside the circuit boards, thereby forming the circuit board having more layers. Therefore, the circuit boards 202, 204 are used as the base for fabricating the multi-layer circuit board having more than three circuit layers, which has an odd number of or an even number of circuit layers.

In summary, since the present invention uses the liquid material and the atmospheric pressure difference to adhere to the first substrate and the second substrate, the circuit board having an odd number of or an even number of circuit layers may be fabricated in mass production, and the present invention may be used for fabricating a variety of circuit boards having different layers to fit the progress of the modern science and technology, thereby satisfying various circuit designs of the current circuit board.

Although the preferred embodiments of the present invention are disclosed as the above, but the embodiments are not intended to limit the scope of the present invention, and those skilled in the art can may amendments and improvements without departing the spirit and scope of the present invention, which still fall within the protection scope of the present invention.

What is claimed is:

1. A fabricating method of a circuit board, comprising the following steps:
   adhering to a liquid material between a first substrate and a second substrate by using an atmospheric pressure difference, the first substrate comprising two first metal layers and a first dielectric layer disposed between the first metal layers, the second substrate comprising two second metal layers and a second dielectric layer disposed between the second metal layers, wherein the liquid material adheres to one of the first metal layers and one of the second metal layers;
   forming at least one first conductive column connecting to the first metal layers in the first dielectric layer;
   forming at least one second conductive column connecting to the second metal layers in the second dielectric layer;
   patterning the first metal layer and second metal layer both without adhered by the liquid material to respectively form a first circuit layer and a second circuit layer;
   forming a first lamination structure on the first circuit layer, wherein the first lamination structure comprises a third metal layer;
   forming a second lamination structure on the second circuit layer, wherein the second lamination structure comprises a fourth metal layer;
   separating the first metal layer and the second metal layer both adhered by the liquid material; and
   patterning the first metal layer, the second metal layer, the third metal layer and the fourth metal layer after the first metal layer and the second metal layer are separated.

2. The fabricating method of a circuit board according to claim 1, wherein the liquid material is water, organic solution, or inorganic salt aqueous solution.

3. The fabricating method of a circuit board according to claim 1, wherein the method of forming the first conductive column comprises the following steps:
   forming at least one blind via in the first dielectric layer before the liquid material adheres to the first substrate and the second substrate; and
   performing a plating hole process to the blind via after the liquid material adheres to the first substrate and the second substrate.

4. The fabricating method of a circuit board according to claim 1, wherein the method of forming the first conductive column comprises the following steps:
   forming at least one blind via in the first dielectric layer after the liquid material adheres to the first substrate and the second substrate; and
   performing a plating hole process to the blind via.

5. The fabricating method of a circuit board according to claim 1, wherein the method of forming the second conductive column comprises the following steps:
   forming at least one blind via in the second dielectric layer before the liquid material adheres to the first substrate and the second substrate; and
   performing a plating hole process to the blind via after the liquid material adheres to the first substrate and the second substrate.

6. The fabricating method of a circuit board according to claim 1, wherein the method of forming the second conductive column comprises the following steps:
   forming at least one blind via in the second dielectric layer after the liquid material adheres to the first substrate and the second substrate; and
   performing a plating hole process to the blind via.

7. The fabricating method of a circuit board according to claim 1, wherein the method of forming the first lamination structure comprises the following steps:
   forming a third dielectric layer covering the first circuit layer; and
   forming the third metal layer on the third dielectric layer.

8. The fabricating method of a circuit board according to claim 7, further comprising the following steps:
   forming at least one third conductive column connecting to the third metal layer and the first circuit layer in the third dielectric layer.

9. The fabricating method of a circuit board according to claim 1, wherein the method of forming the second lamination structure comprises the following steps:

forming a fourth dielectric layer covering the second circuit layer; and forming the fourth metal layer on the fourth dielectric layer.

10. The fabricating method of a circuit board according to claim 9, further comprising the following steps:

forming at least one fourth conductive column connecting to the fourth metal layer and the second circuit layer in the fourth dielectric layer.

* * * * *